United States Patent
Metzger et al.

(10) Patent No.: US 10,680,159 B2
(45) Date of Patent: Jun. 9, 2020

(54) MEMS COMPONENT HAVING A HIGH INTEGRATION DENSITY

(71) Applicant: SNAPTRACK, INC., San Diego, CA (US)

(72) Inventors: Thomas Metzger, München (DE); Jürgen Portmann, München (DE)

(73) Assignee: SnapTrack, Inc., San Diego, CA (US)

( * ) Notice: Subject to any disclaimer, the term of this patent is extended or adjusted under 35 U.S.C. 154(b) by 420 days.

(21) Appl. No.: 15/546,229

(22) PCT Filed: Dec. 18, 2015

(86) PCT No.: PCT/EP2015/080544
§ 371 (c)(1),
(2) Date: Jul. 25, 2017

(87) PCT Pub. No.: WO2016/134803
PCT Pub. Date: Sep. 1, 2016

(65) Prior Publication Data
US 2018/0013055 A1    Jan. 11, 2018

(30) Foreign Application Priority Data
Feb. 27, 2015 (DE) .......... 10 2015 102 869

(51) Int. Cl.
*H01L 41/053* (2006.01)
*H03H 9/05* (2006.01)
(Continued)

(52) U.S. Cl.
CPC .............. *H01L 41/053* (2013.01); *B81B 7/02* (2013.01); *H01L 41/047* (2013.01);
(Continued)

(58) Field of Classification Search
CPC ... H01L 41/053; H01L 41/081; H01L 41/047; H01L 41/0533
See application file for complete search history.

(56) References Cited

U.S. PATENT DOCUMENTS 6,594,369 B1 * 7/2003 Une ..................... H04R 19/016
381/174
8,004,053 B2 * 8/2011 Miyagi ................. B81B 3/0078
257/417
(Continued)

FOREIGN PATENT DOCUMENTS

CN    101309854 A    11/2008
CN    102556939 A     7/2012
(Continued)

OTHER PUBLICATIONS

International Search Report and Written Opinion—PCT/EP2015/080544—ISA/EPO—dated Mar. 22, 2016.

*Primary Examiner* — J. San Martin
(74) *Attorney, Agent, or Firm* — Patterson & Sheridan, LLP

(57) ABSTRACT

A MEMS component having increased integration density and a method for manufacturing such a component are specified. The component comprises a base wafer and a cover wafer arranged over this. A first cavity is arranged between the base wafer and the cover wafer. A second cavity is arranged over the cover wafer, below a thin-layer covering. The cavities contain component structures.

13 Claims, 4 Drawing Sheets

(51) Int. Cl.
*B81B 7/02* (2006.01)
*H01L 41/047* (2006.01)
*H01L 41/08* (2006.01)
*H01L 41/23* (2013.01)

(52) U.S. Cl.
CPC ........ *H01L 41/0533* (2013.01); *H01L 41/081* (2013.01); *H01L 41/23* (2013.01); *H03H 9/0547* (2013.01); *B81B 2207/012* (2013.01); *B81B 2207/095* (2013.01); *B81C 2203/0118* (2013.01); *B81C 2203/0136* (2013.01); *B81C 2203/0145* (2013.01); *B81C 2203/0154* (2013.01); *H01L 2221/00* (2013.01); *H01L 2224/11* (2013.01)

(56) References Cited

U.S. PATENT DOCUMENTS

| | | |
|---|---|---|
| 8,786,130 B1 | 7/2014 | Mori et al. |
| 9,181,081 B2* | 11/2015 | Obara .................. B81B 7/0051 |
| 10,243,535 B2* | 3/2019 | Kawasaki .......... H03H 9/02952 |
| 2005/0250253 A1* | 11/2005 | Cheung .............. B81C 1/00293 438/125 |
| 2008/0247585 A1* | 10/2008 | Leidl .................... B81B 7/0061 381/360 |
| 2009/0001553 A1* | 1/2009 | Pahl ...................... B81B 7/0064 257/704 |
| 2009/0224851 A1* | 9/2009 | Feiertag ................. H03H 9/059 333/186 |
| 2011/0189844 A1 | 8/2011 | Pornin et al. |
| 2012/0126349 A1 | 5/2012 | Horning et al. |
| 2014/0226285 A1 | 8/2014 | Bauer et al. |
| 2015/0225231 A1* | 8/2015 | Henn ................. H03H 9/02393 310/312 |
| 2015/0380634 A1* | 12/2015 | Henn .................. H03H 9/0547 310/344 |
| 2016/0016790 A1 | 1/2016 | Marksteiner |
| 2016/0173059 A1 | 6/2016 | Schmidhammer |
| 2016/0304338 A1* | 10/2016 | Saint-Patrice ...... B81C 1/00293 |
| 2017/0322290 A1* | 11/2017 | Ng ....................... A61B 5/1172 |
| 2018/0269832 A1* | 9/2018 | Obata .................... H01L 23/10 |

FOREIGN PATENT DOCUMENTS

| | | |
|---|---|---|
| CN | 104340949 A | 2/2015 |
| DE | 102013112476 A1 | 5/2015 |
| JP | H0563482 A | 3/1993 |
| JP | H11103228 A | 4/1999 |
| JP | 2007060465 A | 3/2007 |
| JP | 2013031030 A | 2/2013 |
| JP | 2014120966 A | 6/2014 |
| WO | WO-2013034394 A1 | 3/2013 |
| WO | WO-2014135309 A1 | 9/2014 |
| WO | WO-2014135329 A1 | 9/2014 |
| WO | WO-2014135442 A1 | 9/2014 |

* cited by examiner

MEMS COMPONENT HAVING A HIGH INTEGRATION DENSITY

The invention relates to MEMS components, for example electroacoustic filters, in which MEMS structures are arranged protected in cavities, wherein the number of MEMS structures per area is increased.

MEMS components comprise MEMS structures that generally require an encapsulation from harmful environmental influences. Such MEMS structures are, for example, SAW structures, BAW structures or MEMS switches.

MEMS components are subject to the trend toward size and height reduction, and toward cost reduction. At the same time, the signal quality should not be degraded in spite of ever smaller dimensions.

The housing technology that is used therefore provides a decisive contribution to the reduction of the area, the height, and the manufacturing costs of corresponding components.

There are what are known as wafer level packages (WLP). During this, the elements of the housing are still generated on the wafer, meaning before individualization of the later components. One example of an WLP is a chip-scale package (CSP), in which the areas of the finished components and of the chips contained therein do not differ by more than 20%. Given what is known as a die-sized package (DSP), the areas of chip and the total component essentially coincide.

It is an object of the present invention to specify MEMS components that exhibit a greater integration density of the functional elements relative to known components, have good electrical properties, and can be manufactured cost-effectively.

Such a component and a method for manufacturing such a component are specified in the independent claims. Dependent claims specify advantageous embodiments.

An MEMS component comprises a base wafer and a cover wafer arranged above this. The component also comprises a first cavity between the base wafer and the cover wafer, and first component structures in the first cavity. The component also comprises a second cavity above the cover wafer, and second component structures in the second cavity. The MEMS component additionally has a frame that laterally surrounds the first cavity, as well as a thin-layer covering that covers the second cavity.

A MEMS component is therefore specified that has component structures both under the cover wafer and above the cover wafer. The component structure [sic] therein consists of at least partially functional MEMS structures, such that the integration density of the structures is increased. The component structures are respectively arranged in at least one cavity, and thus are protected against harmful environmental influences.

It is possible that the first component structures are arranged directly on the base wafer, or that the second component structures are arranged directly on the cover wafer. However, it is also possible that additional layers or additional structures are arranged between the component structures and the corresponding wafers.

Especially in the instance of SAW structures (SAW=Surface Acoustic Wave) or of GBAW structures (GBAW=Guided Bulk Acoustic Wave), the base wafer or the cover wafer may comprise a piezoelectric material. The component structures may then comprise comb-shaped electrode structures that are arranged directly on the piezoelectric material of the corresponding wafer.

If the component structures comprise BAW structures (BAW=Bulk Acoustic Wave), additional layers—for example acoustic mirror layers or piezoelectric layers—may be arranged between the corresponding wafer (which does not need to be piezoelectric) and the structures.

The base wafer, the cover wafer and the frame enclose the first, lower cavity, wherein the first component structures in the first cavity may be hermetically sealed off from the environment of the MEMS component. However, it is also possible that the first component structures are sensor structures and should detect properties of the environment. It is then possible that the first cavity is connected with the environment of the component at least via a small opening.

Especially if the bonding takes place with a metal frame, a hermetic cavity is possible; however, a metallic bonding frame is problematic if metallic signal conductors should be directed laterally out from this. An additional electrical insulation is then required, for example in the form of a dielectric layer between frame and conductor. In the event that such an insulation layer is introduced, parasitic capacitances could be compensated for via additional circuit components. Purely dielectric bonding frames, for example with silicon nitride, may be hermetic. Polymers may preferably be used as a bonding material if an absolute hermeticity is not required.

The thin-layer cover that covers the second, upper cavity protects the second component structures from harmful effects. The second cavity may also be hermetically sealed off from the environment of the component or may be connected with the environment, for example via one or more openings.

The thin-layer covering used here significantly differs from conventional coverings, for example covers, caps, spanning laminate layers etc., in that its material is thinner than the material of conventional coverings and was applied as a cavity covering by means of a layer deposition process. The number of possible materials is nearly unlimited due to the use of a layer deposition method, for example sputtering (PVD=physical vapor deposition), PECVD (plasma-enhanced chemical vapor deposition) PLD (Pulse Laser Deposition), MBE (Molecular Beam Epitaxy), ALD (atomic layer deposition) etc. The thickness and the form of the thin-layer covering, and other properties (for example hermeticity, mechanical stability etc.), may be individually adjusted accordingly.

It is possible that the thin layer of the thin-layer covering already represents the entire covering of the second covering. However, it is also possible that the thin-layer covering is part of a multi-layer covering. In addition to the thin-layer covering, the covering of the second cavity then additionally comprises at least one further layer of an additional material.

It is possible that the MEMS component also comprises a sealing layer as part of the covering of the second cavity. The thin-layer covering has at least one hole, and the sealing layer is arranged above the thin-layer covering and seals the hole.

A hole in the thin-layer covering may be advantageous in order to simplify a method for manufacturing a corresponding MEMS component. It is thus possible to apply the material of the thin-layer covering onto a sacrificial layer that is removed again through the hole in said thin-layer covering after finishing the thin-layer covering. In order to achieve a hermetically sealed encapsulation of the second cavity, the sealing layer seals the hole or all holes in the thin-layer covering.

It is possible that the MEMS component has a reinforcement layer as part of the covering. The reinforcement layer is arranged above or on the thin-layer covering and mechanically reinforces said thin-layer covering. The reinforcement layer thus serves as part of the covering, essentially to achieve a mechanically stable covering.

It is possible that the MEMS component has a planarization layer as part of the covering of the second cavity. The planarization layer is arranged above or directly on the thin-layer covering and has a planar top side. A planar top side above the second cavity is advantageous if additional structures—for example signal conductors and/or circuit elements and/or connection surfaces for an external wiring—should be arranged on the top side of the component.

It is accordingly possible that the MEMS component has a rewiring layer as part of the covering. The rewiring layer is arranged above or directly on the thin-layer covering and comprises at least one layer of a dielectric material as well as a signal conductor.

It is possible that the MEMS component has a passivation layer as part of the covering. The passivation layer is arranged above or directly on the thin-layer covering. The passivation layer may serve to provide a chemically inert surface and to improve the density of the covering.

The sealing layer, the reinforcement layer, the planarization layer, the rewiring layer and the passivation layer may respectively form the covering of the second cavity individually or in combination with the thin-layer covering. It is possible that a layer above or on the thin-layer covering satisfies more than one of the aforementioned tasks and thus, for example, represents a planarization layer and simultaneously a passivation layer.

In the rewiring layer, a circuit element may be arranged that is selected from: a passive circuit element, an inductive element, a capacitive element, a resistive element, and a stripline.

The circuit element preferably comprises electrically conductive structures that are embedded in the dielectric material of the rewiring layer.

It is possible that the MEMS component also comprises a first electrical connection surface on the top side of the component. In addition to this, there is also a signal conductor that wires the first component structures with the first connection surface. The signal conductor in this travels at least in segments on an outer lateral surface of the component.

A MEMS component is thereby obtained in which a signal conductor is directed not via a throughplating through the cover wafer, but rather around the cover wafer. It has been recognized that throughplatings through wafers are possible in principle, but pose technical problems here. The generation of holes in a wafer is thus relatively expensive and leads to a mechanical weakening of the wafer. Moreover, in order to enable an acceptable volume resistance on the order of approximately 10 mΩ, only a small selection of suitable materials (for example highly conductive metals such as copper, silver or gold) is suitable [sic] for the realization of RF-suitable throughplatings. For these materials, the compatibility with the wafer materials is also not always a given, especially with regard to coefficients of thermal expansion or their diffusion behavior. For the realization of RF-suitable throughplatings, a relatively large diameter (for example 30 μm or more) is thus necessary in order to achieve a low resistance. The manufacturing method is in particular very complicated if a diffusion barrier is required between the wafer material and the throughplating material, which is necessary given copper as a throughplating material and silicon as a wafer material, for example. Moreover, due to different coefficients of thermal expansion, a throughplating completely filled with metal may lead to mechanical stresses in the material system, which ultimately may also result in chip or wafer breakage. As an alternative to solidly filled throughplating, throughplatings are possible in which only the perforated wall is coated with metal. However, an even more elaborate deposition method would be required for this.

These problems may be avoided by directing the signal conductor outside, past the material of the cover wafer. For this, material of the signal conductor from the first component structures may be directed laterally out from the first cavity, between frame and material of the base wafer or between frame and material of the cover wafer.

It is possible that the MEMS component has a second connection surface on the top side of the component. The MEMS component also comprises a throughplating that connects the second component structures with the second connection surface. The throughplating does not need to be directed through a wafer material for this. It is sufficient to direct the throughplating through a material of the thin-layer covering and/or the material of an additional layer of the covering, or of the layer stack of the covering of the second cavity.

It is thus possible in particular that the MEMS component contains no throughplating through the material of the cover wafer.

The first and second component structures may be selected from SAW structures, BAW structures, GBAW structures, microphone membranes, microphone backplanes, and MEMS structures.

If the MEMS component comprises a sealing layer, its material may be selected entirely or at least partially from a dielectric material, an organic material, a silicon nitride (for example $Si_3N_4$), a silicon oxide (for example $SiO_2$), an aluminum oxide (for example $Al_2O_3$).

If the MEMS component comprises a reinforcement layer, its material may be selected entirely or at least partially from a dielectric material, an organic material, a polymer, BCB (benzocyclobutene), an inorganic material, a silicon nitride (for example $Si_3N_4$), a silicon oxide (for example $SiO_2$), an aluminum oxide (for example $Al_2O_3$).

If the component comprises a planarization layer, its material may be selected entirely or at least partially from a dielectric material, an organic material, a polymer, BCB, a laminate, an inorganic material, a silicon nitride (for example $Si_3N_4$), a silicon oxide (for example $SiO_2$), an aluminum oxide (for example $Al_2O_3$).

If the MEMS component comprises a passivation layer and/or a rewiring layer, its material may be selected entirely or at least partially from a dielectric, an organic material, a polymer, BCB, a solder resist, an inorganic material, a silicon nitride (for example $Si_3N_4$), a silicon oxide (for example $SiO_2$), an aluminum oxide (for example $Al_2O_3$).

It is possible that, in addition to the thin-layer covering, the MEMS component has in the covering of the upper cavity a sealing layer, a reinforcement layer, a planarization layer, a passivation layer, and a rewiring layer. It is also possible that, in addition to the thin-layer covering, the covering also has only one additional, two additional, three additional or four additional layers of the aforementioned layers.

It is possible that the base wafer and the cover wafer of the component are comprised of the same material, or of material having nearly identical coefficients of thermal expansion.

This avoids or reduces thermally induced stresses during the manufacture or during the operation of the component. If a material of the cover wafer or a material of the base wafer expands to different degrees in different spatial directions, it is thus advantageous to select the alignments of the materials so that expansions in the same directions are essentially of the same degree. If the wafers comprise the same materials, for example, it is preferred to align the crystal axes of the wafers in parallel.

The sides of the MEMS component may be beveled. This means that the cross section of the component decreases toward the top.

A method to produce a MEMS component with increased integration density may include the following steps
provide a base wafer,
generate first component structures and a frame on the same base wafer,
provide a cover wafer,
generate second component structures on the cover wafer,
arrange the cover wafer on the frame, and form a first cavity between base wafer, cover wafer and frame,
form a thin-layer covering over the second component structures.

The step to form the thin-layer covering may in particular include the following sub-steps
apply a sacrificial material onto the second component structures,
deposit a thin-layer covering onto the sacrificial material in the form of a thin layer, by means of a layer deposition method,
structure at least one hole in the thin-layer covering,
remove the sacrificial material below the thin-layer covering.

Ideas and functional principles that form the basis of the MEMS component or of the method for producing such a component, as well as examples of designs and embodiments, are explained in detail using schematic Figures.

Shown are:

FIG. 1: a simple embodiment of the MEMS component,

FIG. 2: an additional embodiment of the component, with connection possibilities on its top side, FIG. 3: a first intermediate step in the manufacturing of the component, FIG. 4: a second intermediate step in the manufacturing of the component, FIG. 5: an additional intermediate step in the manufacturing of the component, FIG. 6: an additional intermediate step, FIG. 7: an additional intermediate step, FIG. 8: an additional intermediate step, FIG. 9: an additional intermediate step, FIG. 10: an additional intermediate step in the manufacturing of the upper part of the component, FIG. 11: an additional intermediate step in which the upper part of the component and the lower part of the component are joined, FIG. 12: an additional intermediate step, FIG. 13: an additional intermediate step, FIG. 14: finished components as a result, after manufacturing, FIG. 15: an additional embodiment of the MEMS component.

FIG. 1 shows a possible embodiment of the component in which the BAW component structures are arranged as first component structures in the first cavity H1 and additional BAW component structures are arranged as second component structures in the second cavity H2. A frame R serves as a spacer and seal—for example a hermetic seal given use of metal as a frame material—between the cover wafer DW and the base wafer BW. The first component structures are arranged directly on the base wafer BW. Additional acoustic mirror layers arranged between the BAW structures in the first cavity H1 and the base wafer BW are likewise possible, but are not shown for the sake of a simplified overview. Acoustic mirror layers may likewise be arranged on the cover wafer DW and below the second component structures. A thin-layer covering DSA upwardly bounds the second cavity H2 and covers the second component structures. A planarization layer PS with flat top side is arranged on the thin-layer covering DSA. A signal conductor SL travels on the outside of the component MB, at least in segments. Via such a signal conductor SL, the various component structures may be connected with one another, and if applicable with connection pads on the outside (for example on the top side) of the component MB.

Via signal conductors SL directed on the outside of the component MB, the disadvantages linked with throughplatings through the cover wafer DW are avoided in particular.

FIG. 2 shows an embodiment of the component in which the lateral surfaces of the component are beveled and signal conductors SL are arranged on the beveled lateral surfaces, which signal conductors SL connect component structures with contact surfaces KF on the top side of the component. The first component structures BS1 as BAW component structures and the second component structures BS2 as BAW component structures are shown as examples. In addition to the first component structures BS1, additional component structures are contained in the first cavity. In addition to the second cavity H2, above the cover wafer DW exists a further cavity that has essentially a design similar to that of the second cavity H2. Arranged over the planarization layer PS is a rewiring layer US. Traveling therein are segments of signal conductors that are connected via throughplatings DK with contact surfaces KF. Via the rewiring layer US, it is essentially possible to select the layer of the contact surfaces KF so that the component may be directly connected with predetermined contact surfaces of an external circuit environment, and the layer of the component structures may nevertheless be freely selected in the component.

Figure 1:
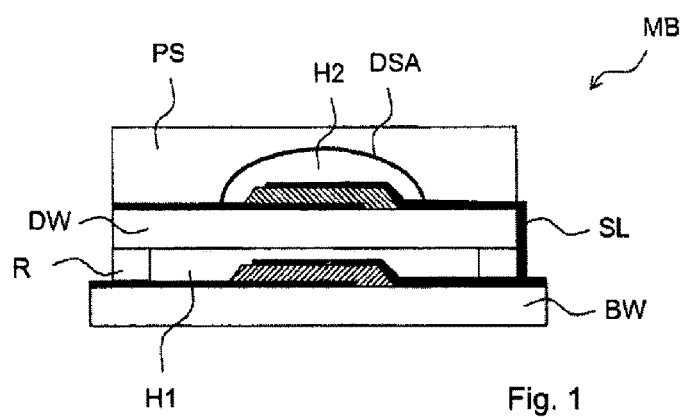
Figure 2:
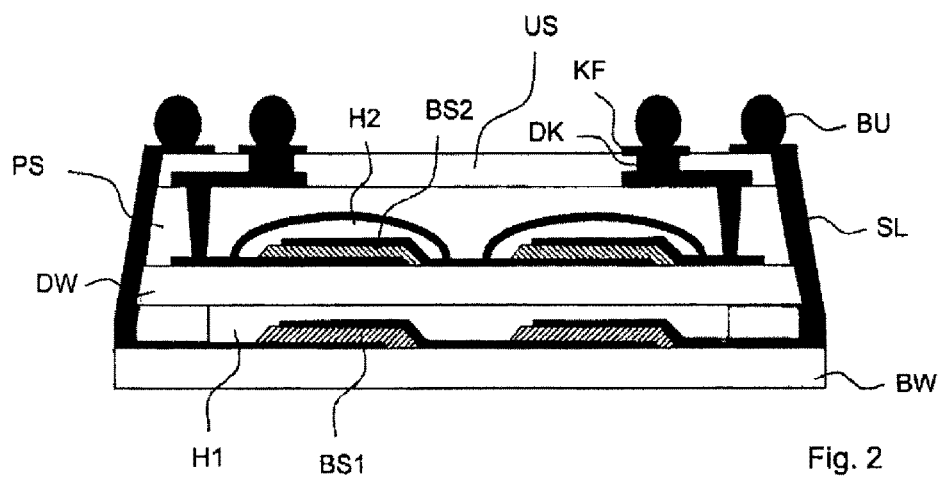
Figure 3:
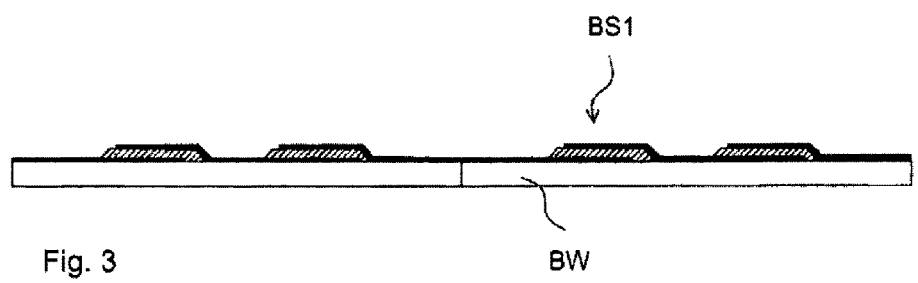
FIG. 3 shows a first intermediate step for the production of a corresponding MEMS component in which first component structures BS1 (here shown as BAW component structures, for example) are arranged on a large-area base wafer BW.
Figure 4:
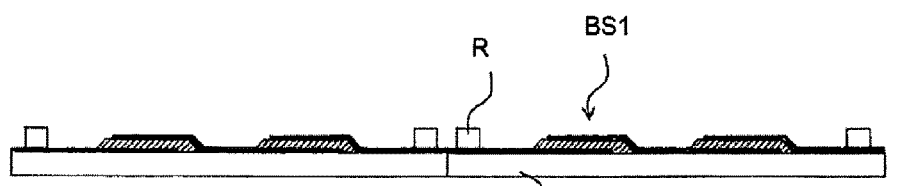
FIG. 4 shows an additional intermediate step in which additional frame structures R are arranged on the top side of the base wafer BW. The first component structures BS1 and the frame structures may thus be created in a repeat usage, meaning before the individualization of the base wafer into a plurality of individual component segments.
Figure 5:
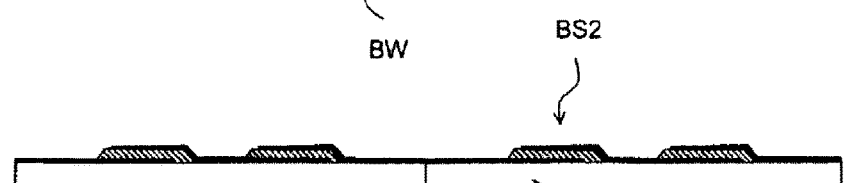
Figure 6:
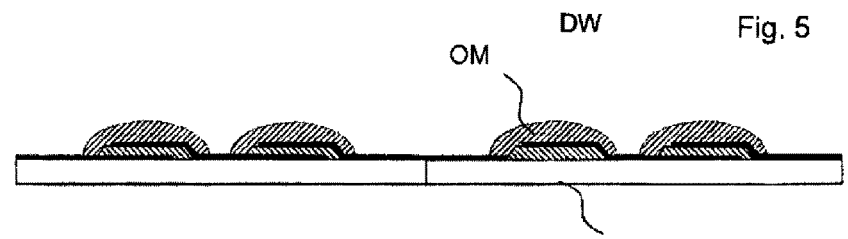

FIG. 5 shows an additional intermediate step, wherein second component structures are arranged on the top side of the cover wafer DW. The second component structures are covered by a thin-layer covering, such that no frame structures are necessary on the top side of the cover wafer DW. As shown in FIG. 6, instead a sacrificial material OM is generated and shaped over the second component structures. The shape of the sacrificial material OM therein significantly determines the shape of the later cavity H2.

Figure 7:
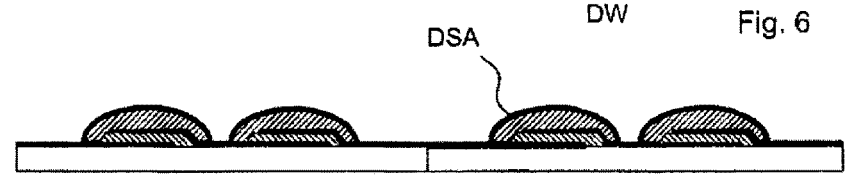

As shown in FIG. 7, the material of the thin-layer covering DSA is deposited on the material of the sacrificial layer OM.

Figure 8:
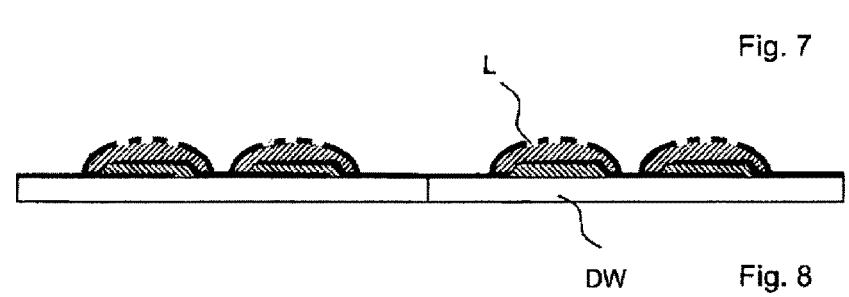

FIG. 8 shows an additional intermediate step, wherein holes L have been structured in the thin-layer covering DSA.

Figure 9:
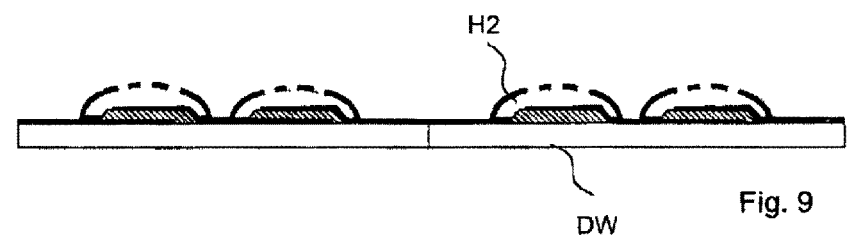

FIG. 9 shows an additional intermediate step, wherein the sacrificial material OM has been removed through the holes in the thin-layer covering.

Figure 10:
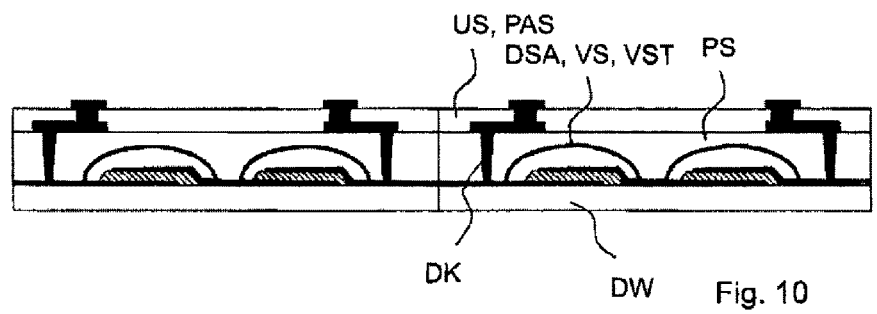

FIG. 10 shows an additional intermediate step, wherein the holes in the thin-layer covering are sealed by a sealing layer VS, and the thin-layer covering DSA is reinforced by a reinforcement layer VST and covered by a planarization layer PS. A rewiring layer US was arranged over the planarization layer PS. Throughplatings DK through the material of the planarization layer PS connect signal conductors on the top side of the cover wafer DW with signal conductors on the top side of the planarization layer PS, i.e. with signal conductors embedded in the rewiring layer US. The component structures may be connected with contact surfaces on the top side of the component via an additional throughplating through the rewiring layer US. The component may have a passivation layer PAS. The passivation layer PAS may be an additional layer and one of the uppermost layers. The passivation layer may also coincide with one of the other layers, for example the rewiring layer US.

Figure 11:
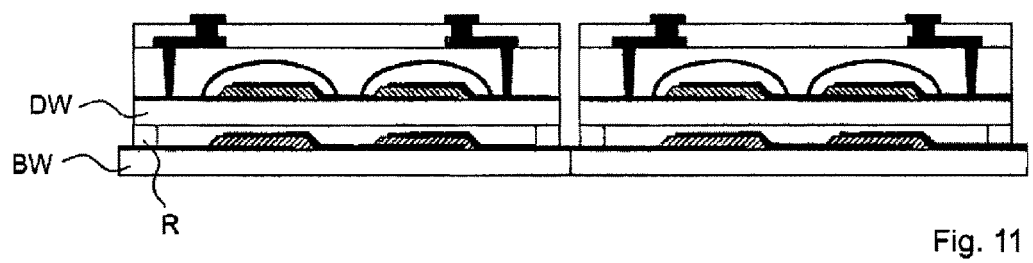

FIG. 11 shows an additional intermediate step in which the upper parts of the component (see FIGS. 5-10) are already individualized and connected with the frame structures R on the base wafer BW. Cover wafer DW and base wafer BW may be connected with one another via the frame R, for example via the typical bonding methods.

Figure 12:
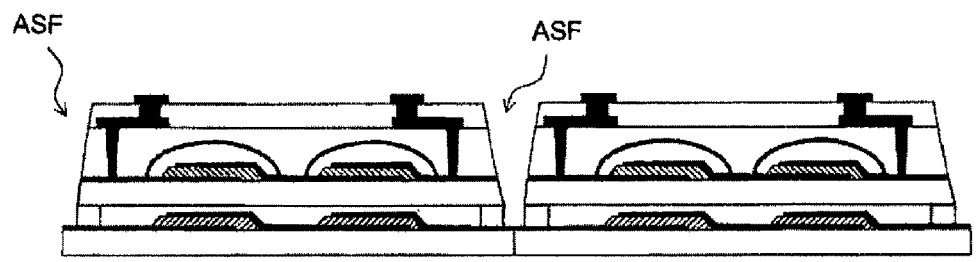

FIG. 12 shows an additional intermediate step in which segment [sic] of the lateral surfaces ASF of the components are beveled. Given beveling, material of the cover wafer of the planarization layer is removed so that signal conductors on the top side of the base wafer are uncovered.

Figure 13:
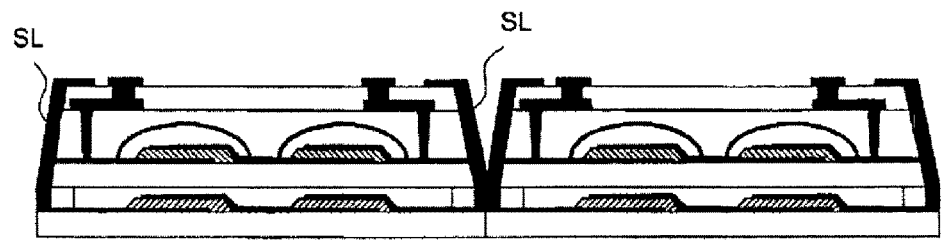

FIG. 13 accordingly shows how the uncovered signal conductors are connected with one another by depositing a conductive material.

Figure 14:
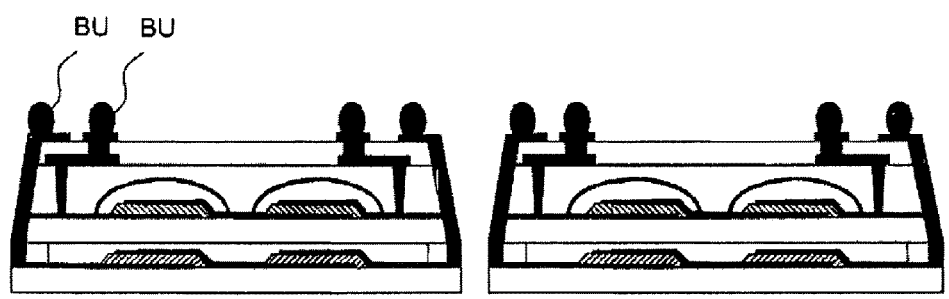

FIG. 14 shows finished components in which the base wafer is ultimately also cut through along the individualization lines provided for this. The contact surfaces on the top side of the components are occupied by solder balls so that a connection with external circuit environments is possible via bump joints BU.

Figure 15:
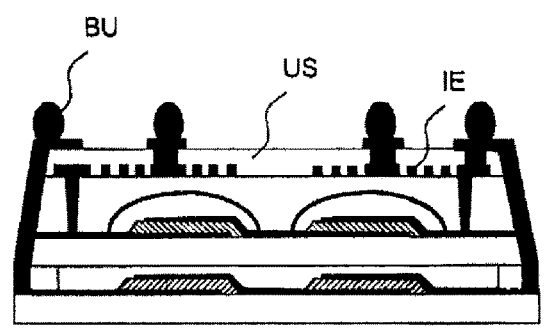

FIG. 15 shows an embodiment of a MEMS component which, within the rewiring layer US, receives an embedded inductive element IE, for example. Other circuit elements are likewise possible, especially passive circuit elements within the rewiring layer US.

The component, or the method for manufacturing the component, is not limited to the shown exemplary embodiments. Components having additional cavities, additional wafers or additional thin-layer coverings, or manufacturing methods for accordingly more complex component elements, are likewise covered by the claims.

LIST OF REFERENCE SIGNS

ASF: beveled lateral surface
BS1: first component structures
BS2: second component structures
BU: bump joint
BW: base wafer
DK: throughplating
DSA: thin-layer covering
DW: cover wafer
H1: first cavity
H2: second cavity
IE: inductive element
KF: contact surface
L: hole
MB: MEMS component
OM: sacrificial material
PAS: passivation layer
PS: planarization layer
R: frame
SL: signal conductor
US: rewiring layer
VS: sealing layer
VST: reinforcement layer

The invention claimed is:

1. A microelectromechanical system (MEMS) component (MB), comprising:
   a base wafer (BW);
   a cover wafer (DW) arranged over the base wafer;
   a first cavity (H1) between the base wafer (BW) and the cover wafer (DW);
   first component structures (BS1) in the first cavity (H1);
   a second cavity (H2) over the cover wafer (DW);
   second component structures (BS2) in the second cavity (H2);
   a frame (R) that laterally encloses the first cavity (H1);
   a thin-layer covering (DSA) that covers the second cavity (H2), wherein the thin-layer covering (DSA) has a hole (L); and
   a sealing layer (VS), wherein the sealing layer (VS) is arranged over the thin-layer covering (DSA) and seals the hole (L).

2. The MEMS component according to claim 1, further comprising a reinforcement layer (VST) that is arranged over the thin-layer covering (DSA) and mechanically reinforces the thin-layer covering (DSA).

3. The MEMS component according to any one of claims 1 and 2, further comprising a planarization layer (PS) that is arranged over the thin-layer covering (DSA) and has a flat top side.

4. The MEMS component according to any one of claims 1 and 2, further comprising a rewiring layer (US) that contains a dielectric material as well as a signal conductor (SL) and is arranged over the thin-layer covering (DSA).

5. The MEMS component according to claim 4, further comprising a circuit element that is arranged in the rewiring layer and is selected from: a passive circuit element, an inductive element, a capacitive element, a resistive element, and a stripline.

6. The MEMS component according to any one of claims 1 and 2, further comprising a passivation layer (PAS) that is arranged over the thin-layer covering (DSA).

7. The MEMS component according to any one of claims 1 and 2, further comprising a first connection surface on a top side of the MEMS component (MB) and a signal conductor (SL) that connects the first component structures (BS1) with the first connection surface and travels at least in segments on an outer, lateral surface (ASF) of the MEMS component (MB).

8. The MEMS component according to any one of claims 1 and 2, further comprising a second connection surface on the top side of the MEMS component (MB) and a throughplating (DK) that connects the second component structures (BS2) with the second connection surface.

9. The MEMS component according to any one of claims 1 and 2, that contains no throughplating (DK) through the cover wafer (DW).

10. The MEMS component according to any one of claims 1 and 2, wherein the first (BS1) and second (BS2) component structures are selected from: SAW structures, BAW structures, GBAW structures, microphone membranes, and MEMS structures.

11. The MEMS component according to claim 1, wherein the sealing layer (VS) comprises a material that is selected from: a dielectric material, an organic material, a polymer, benzocyclobutene (BCB), an inorganic material, silicon nitride, silicon oxide, and aluminum oxide, and wherein the MEMS component further comprises:

a reinforcement layer (VST) whose material is selected from: a dielectric material, an organic material, a polymer, BCB, an inorganic material, silicon nitride, silicon oxide, and aluminum oxide;

a planarization layer (PS) whose material is selected from: a dielectric material, an organic material, a polymer, BCB, a laminate, an inorganic material, silicon nitride, silicon oxide, and aluminum oxide; and at least one of a passivation layer (PAS) or a rewiring layer (US) whose material is selected from: a dielectric material, an organic material, a polymer, BCB, a solder resist, an inorganic material, silicon nitride, silicon oxide, and aluminum oxide.

12. The MEMS component according to any one of claims 1 and 2, wherein the base wafer (BW) and the cover wafer (DW) comprise a same material or materials having nearly identical coefficients of thermal expansion.

13. A method for producing a microelectromechanical system MEMS component (MB), comprising:

providing a base wafer (BW);

generating first component structures (BS1) and a frame (R) on the base wafer (BW);

providing a cover wafer (DW);

generating second component structures (BS2) on the cover wafer (DW);

arranging the cover wafer (DW) on the frame;

forming a first cavity (H1) between the base wafer (BW), the cover wafer (DW), and the frame (R); and forming a thin-layer covering (DSA) over the second component structures (BS2), wherein forming the thin-layer covering (DSA) comprises:

applying a sacrificial material (OM) onto the second component structures (BS2);

depositing a thin-layer covering (DSA) onto the sacrificial material (OM) in a form of a thin layer, by means of a layer deposition method;

forming at least one hole (L) in the thin-layer covering (DSA); and removing the sacrificial material (OM) below the thin-layer covering (DSA).

* * * * *